(12) United States Patent
Kim et al.

(10) Patent No.: US 10,177,278 B2
(45) Date of Patent: Jan. 8, 2019

(54) SEMICONDUCTOR LIGHT EMITTING DEVICE

(71) Applicant: SAMSUNG ELECTRONICS CO., LTD., Suwon-si, Gyeonggi-do (KR)

(72) Inventors: Ju Hyun Kim, Seoul (KR); Jae Ryung Yoo, Uiwang-si (KR); Gi Bum Kim, Yongin-si (KR); Ha Yeong Son, Hwaseong-si (KR); Sang Seok Lee, Seoul (KR)

(73) Assignee: SAMSUNG ELECTRONICS CO., LTD., Suwon-si, Gyeonggi-do (KR)

(\*) Notice: Subject to any disclaimer, the term of this patent is extended or adjusted under 35 U.S.C. 154(b) by 40 days.

(21) Appl. No.: 15/437,970

(22) Filed: Feb. 21, 2017

(65) Prior Publication Data
US 2018/0019380 A1    Jan. 18, 2018

(30) Foreign Application Priority Data

Jul. 18, 2016    (KR) .................... 10-2016-0090901

(51) Int. Cl.
*H01L 33/48*    (2010.01)
*H01L 33/38*    (2010.01)
*H01L 33/44*    (2010.01)

(52) U.S. Cl.
CPC ............ *H01L 33/382* (2013.01); *H01L 33/44* (2013.01)

(58) Field of Classification Search
CPC .............. H01L 33/382; H01L 33/44; H01L 33/58–33/60; H01L 2933/0058; H01L 33/62; H01L 33/647; H01L 33/08; H01L 27/15–27/156; H01L 33/48; H01L 33/40; H01L 33/0075; H01L 33/007; H01L 33/22; H01L 33/24; H01L 33/28; H01L 33/385; H01L 33/387; F21K 9/00–9/278
See application file for complete search history.

(56) References Cited

U.S. PATENT DOCUMENTS

| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |

(Continued)

FOREIGN PATENT DOCUMENTS

| EP | 2 728 631 A1 | 5/2014 |
| KR | 10-2010-0128861 A | 12/2010 |

(Continued)

*Primary Examiner* — Moazzam Hossain
*Assistant Examiner* — Stanetta Isaac
(74) *Attorney, Agent, or Firm* — Lee & Morse, P.C.

(57) ABSTRACT

A semiconductor light emitting device includes: a multilayer semiconductor body having a first conductivity-type semiconductor layer, a second conductivity-type semiconductor layer, an active layer between the first conductivity-type semiconductor layer and the second conductivity-type semiconductor layer, and at least one recess exposing the first conductivity-type semiconductor layer, and an insulating part on an internal sidewall of the at least one recess and an upper surface of the second conductivity-type semiconductor layer. The insulating part has an insulating spacer on the internal sidewall of the recess, and a lateral surface of the insulating spacer has a surface without an angular point from an upper end to a lower end thereof.

12 Claims, 10 Drawing Sheets

(56) References Cited

U.S. PATENT DOCUMENTS

| | | |
|---|---|---|
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,142,730 B2 | 9/2015 | Han et al. |
| 9,166,109 B2 | 10/2015 | Yang et al. |
| 9,293,660 B2 | 3/2016 | Chae et al. |
| 9,293,664 B2 | 3/2016 | Seo et al. |
| 2013/0334552 A1* | 12/2013 | Yang ............ H01L 33/382 257/98 |
| 2014/0209955 A1 | 7/2014 | Kim et al. |
| 2015/0087096 A1* | 3/2015 | Han ............ H01L 33/42 438/29 |
| 2015/0194579 A1 | 7/2015 | Chung et al. |
| 2015/0280086 A1 | 10/2015 | Jang et al. |
| 2016/0072011 A1 | 3/2016 | Chae et al. |

FOREIGN PATENT DOCUMENTS

| | | |
|---|---|---|
| KR | 10-1565122 B1 | 11/2015 |
| KR | 10-2016-0009098 A | 1/2016 |
| KR | 10-2016-0025456 A | 3/2016 |
| KR | 10-2016-0032978 A | 3/2016 |

* cited by examiner

FIG. 21

SEMICONDUCTOR LIGHT EMITTING DEVICE

CROSS-REFERENCE TO RELATED APPLICATION

Korean Patent Application No. 10-2016-0090901, filed on Jul. 18, 2016, in the Korean Intellectual Property Office, and entitled: "Semiconductor Light Emitting Device," is incorporated by reference herein in its entirety.

BACKGROUND

1. Field

Embodiments relate to a semiconductor light emitting device.

2. Description of the Related Art

Semiconductor light emitting devices have been widely used in a range of applications, such as in display devices as backlight light sources, in lighting apparatuses, and the like. Particularly, a group III nitride semiconductor emitting light in a short-wavelength region, such as blue light, has come to prominence.

In recent years, research into improving the light emitting efficiency of semiconductor light emitting devices has been actively conducted. Particularly, semiconductor light emitting devices having various structures have been developed to have improved light emitting efficiency and optical power.

SUMMARY

According to one or more embodiments, a semiconductor light emitting device may include: a multilayer semiconductor body having a first conductivity-type semiconductor layer and a second conductivity-type semiconductor layer, and an active layer between the first conductivity-type semiconductor layer and the second conductivity-type semiconductor layer, and having at least one recess passing through the second conductivity-type semiconductor layer and the active layer to expose the first conductivity-type semiconductor layer; an insulating part disposed on an internal sidewall of the at least one recess and an upper surface of the second conductivity-type semiconductor layer, and having at least one first opening located in a portion of the first conductivity-type semiconductor layer and at least one second opening located in a portion of the second conductivity-type semiconductor layer; a first electrode connected to a portion of the first conductivity-type semiconductor layer through the at least one first opening; and a second electrode connected to a portion of the second conductivity-type semiconductor layer through the at least one second opening. The insulating part may have an insulating spacer disposed on the internal sidewall of the recess, and a lateral surface of the insulating spacer may have a surface without an angular point from an upper end to a lower end thereof.

According to one or more embodiments, a semiconductor light emitting device may include: a multilayer semiconductor body having a first conductivity-type semiconductor layer and a second conductivity-type semiconductor layer, and an active layer disposed between the first conductivity-type semiconductor layer and the second conductivity-type semiconductor layer, and having a recess passing through the second conductivity-type semiconductor layer and the active layer to expose a portion of the first conductivity-type semiconductor layer; a first electrode connected to the portion of the first conductivity-type semiconductor layer located on a bottom surface of the recess; a second electrode on the second conductivity-type semiconductor layer to be connected to the second conductivity-type semiconductor layer; a protective insulating layer on the second conductivity-type semiconductor layer to cover the second electrode; and an insulating spacer connected to the protective insulating layer to be disposed on an internal sidewall of the recess. A normal inclination at an arbitrary point located on a lateral surface of the insulating spacer may be increased or may not be changed toward the bottom surface of the recess.

According to one or more embodiments, a semiconductor light emitting device may include a multilayer semiconductor body including a first conductivity-type semiconductor layer, a second conductivity-type semiconductor layer, an active layer between the first conductivity-type semiconductor layer and the second conductivity-type semiconductor layer, and a recess passing through the second conductivity-type semiconductor layer and the active layer to expose a portion of the first conductivity-type semiconductor layer, a first electrode connected to the portion of the first conductivity-type semiconductor layer located on a bottom surface of the recess, a second electrode on the second conductivity-type semiconductor layer to be connected to the second conductivity-type semiconductor layer, a protective insulating layer on the second conductivity-type semiconductor layer to cover the second electrode, and an insulating spacer connected to the protective insulating layer and on an internal sidewall of the recess. A contact region between the portion of the first conductivity-type semiconductor layer and the first electrode may be greater than 50% of the bottom surface of the recess.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
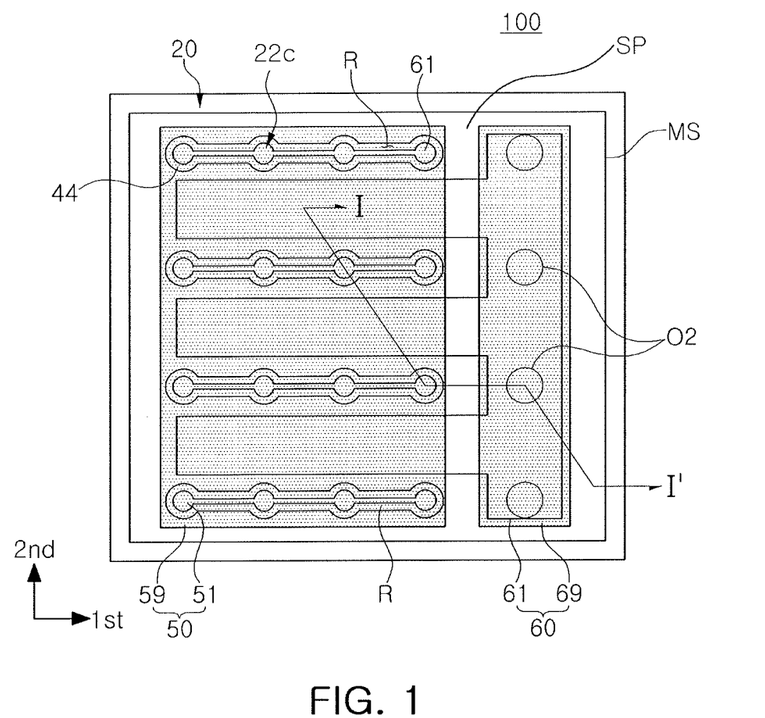
FIG. 1 illustrates a plan view of a semiconductor light emitting device according to an example embodiment.
Figure 2:
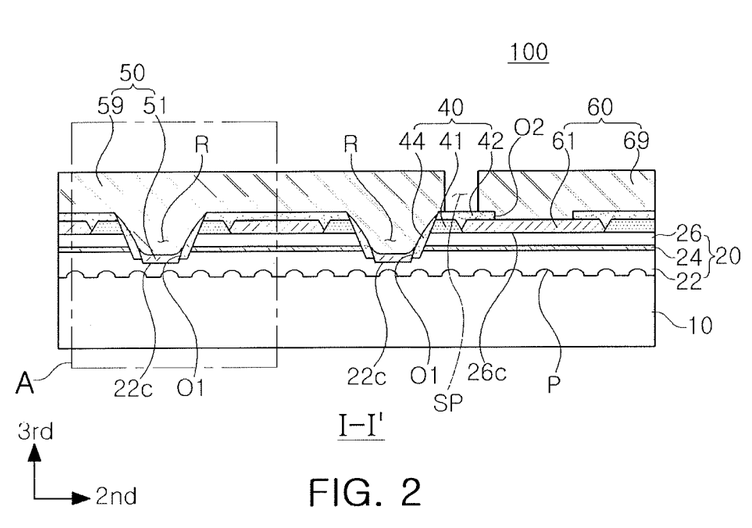
FIG. 2 illustrates a side cross-sectional view of the semiconductor light emitting device illustrated in FIG. 1.

FIG. 1 is a plan view illustrating a semiconductor light emitting device according to an example embodiment. FIG. 2 is a side cross-sectional view illustrating the semiconductor light emitting device illustrated in FIG. 1.

With reference to FIG. 1, a semiconductor light emitting device 100 includes a substrate 10 and a multilayer semiconductor body 20 disposed on the substrate 10. The multilayer semiconductor body 20 may include a first conductivity-type semiconductor layer 22, an active layer 24, and a second conductivity-type semiconductor layer 26.

The substrate 10 may be an insulating, conductive, or semiconductor substrate. For example, the substrate 10 may be formed using sapphire, silicon carbide (SiC), silicon (Si), $MgAl_2O_4$, magnesium oxide (MgO), $LiAlO_2$, $LiGaO_2$, or gallium nitride (GaN).

The first conductivity-type semiconductor layer 22 may be provided as a nitride semiconductor layer satisfying $Al_xIn_yGa_{1-x-y}N$ ($0 \le x \le 1$, $0 \le y \le 1$, $0 \le x+y \le 1$) and may be doped with an n-type impurity such as Si. For example, the first conductivity-type semiconductor layer 22 may be formed using n-type GaN. The second conductivity-type semiconductor layer 26 may be provided as a nitride semiconductor layer satisfying $Al_xIn_yGa_{1-x-y}N$ and may be doped with a p-type impurity, e.g., magnesium (Mg). For example, the second conductivity-type semiconductor layer 26 may be formed using p-type AlGaN/GaN. The active layer 24 may have a multiple quantum well (MQW) structure in which a quantum well layer and a quantum barrier layer are alternately stacked. For example, when a nitride semiconductor is used, the active layer 24 may have a GaN/InGaN MQW structure.

The multilayer semiconductor body 20 may have a recess R for providing a contact area 22C of the first conductivity-type semiconductor layer 22. The recess R may be formed by partially removing the second conductivity-type semiconductor layer 26 and the active layer 24 to expose the contact area 22C of the first conductivity-type semiconductor layer.

In an example embodiment, the recess R, as illustrated in plan view in FIG. 1, may have a shape in which a plurality of circular recesses are connected to each other by a linear recess, e.g., extending along a first direction, but is not limited thereto. The recess R may have various shapes, e.g., a linear shape, a circular shape, and a polygonal shape, or other combinations.

The semiconductor light emitting device 100 may include an insulating part 40 disposed on a surface of the multilayer semiconductor body 20. The insulating part 40 may be provided as a passivation layer for protecting the multilayer semiconductor body 20. The insulating part 40 may include a protective insulating layer 42 disposed on an upper surface of the second conductivity-type semiconductor layer 26 and an insulating spacer 44 disposed in an internal sidewall of the recess R. A lateral surface of the insulating spacer 44 may have a surface without an angular point from an upper end to a lower end thereof.

The term "angular point" used in the detailed description, refers to not only a sharp point or a point having a certain angle, but also a discontinuous point such as a concave portion or a bent portion. A profile of a lateral surface of the insulating spacer 44 will be described in more detail with reference to FIGS. 3, 4, and 5.

In addition, the insulating part 40 may include an edge insulating layer 41 disposed along an edge of an upper surface of the second conductivity-type semiconductor layer 26. The edge insulating layer 41 may be under the protective insulating layer 42, i.e., the edge insulating layer 41 and the protective insulating layer 42 may partially overlap along a third direction.

An upper portion of the insulating spacer 44 may be adjacent to and in contact with the protective insulating layer 42. A middle portion of the insulating spacer 44 may extend along and contact a side wall in the recess R of the edge insulating layer 41. A lower portion of the insulating spacer 44 may extend along and contact sidewalls of the multilayer semiconductor body 20 in the recess R. In particular, the insulating spacer 44 may extend along an entirety of the sidewalls of the second-conductivity layer 26 and the active layer 24, and may only partially extend along the sidewall of the first-conductivity type semiconductor layer 22.

The insulating part 40 may have a plurality of first openings O1 located in the contact area 22C of the first conductivity-type semiconductor layer 22 and a plurality of second openings O2 located in a contact area 26C of the second conductivity-type semiconductor layer 26. In an example embodiment, the first opening O1 may be a region surrounded by the insulating spacer 44. The second opening O2 may be a region surrounded by the edge insulating layer 41.

The semiconductor light emitting device 100 may include a first electrode 50 connected to the contact area 22C of the first conductivity-type semiconductor layer 22 through the first opening O1, and a second electrode 60 connected to an upper surface of a second conductivity-type semiconductor layer 24 through the second opening O2. In an example embodiment, the first electrode 50 may include a first contact electrode 51 and a first bonding metal 59. The second electrode 60 may include a second contact electrode 61 and a second bonding metal 69. In a flip chip structure, the first contact electrode 51 and the second contact electrode 61 may be provided as a reflective electrode. For example, the first contact electrode 51 may include chromium (Cr)/gold (Au), and the second contact electrode 61 may include silver (Ag).

As illustrated in FIG. 1, the first bonding metal 59 and the second bonding metal 69 may be located to be adjacent to both edges opposing each other, respectively. In other words, the first bonding metal 59 and the second bonding metal 69 may be separated by a spacer SP along the first direction and may be coplanar, i.e., have a same height along the third direction. The spacer SP may extend along the second direction.

The first bonding metal 59 may be connected to the first contact electrode 51, and may be disposed on the insulating spacer 44 and the protective insulating layer 42, adjacent to the first contact electrode. The second bonding metal 69 may be in contact with the second contact electrode 61, and may be disposed on the protective insulating layer 42 adjacent around the second contact electrode 61. In other words, the protective insulating layer 42 may cover both opposing edges along the second direction and sidewalls of the second contact electrode 61.

Figure 3:
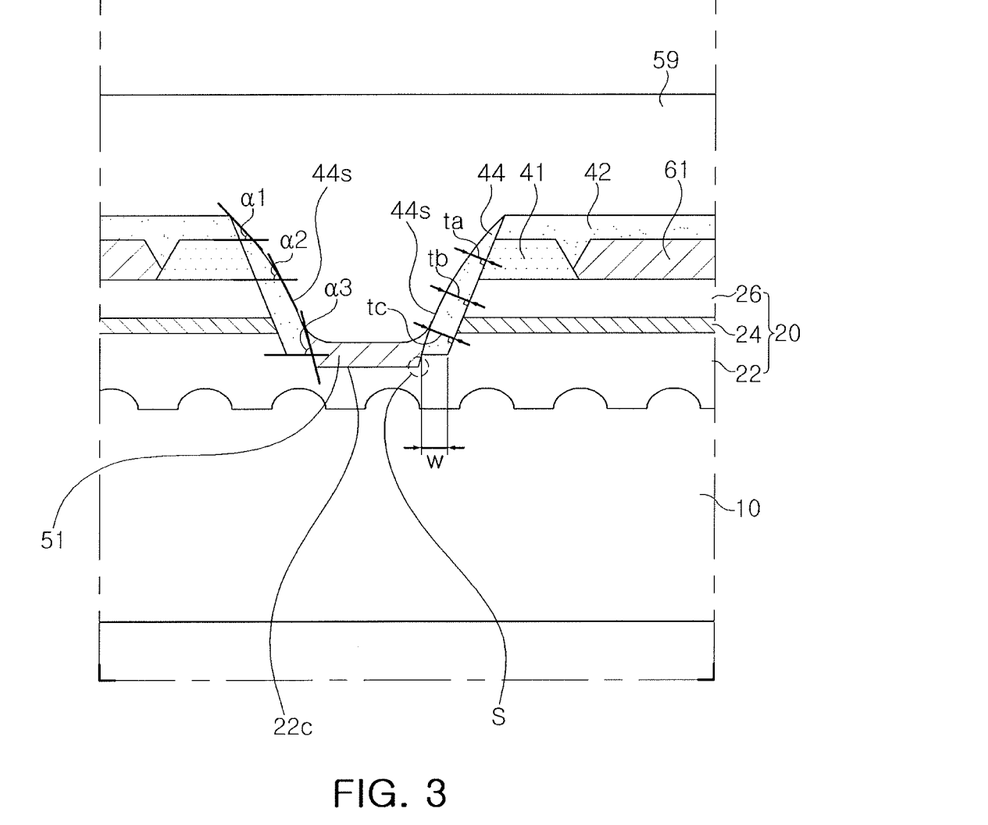
FIG. 3 illustrates a partially-enlarged view of a portion of the semiconductor light emitting device illustrated in FIG. 2.

FIG. 3 illustrates enlarged portion A of the semiconductor light emitting device illustrated in FIG. 2 showing the insulating part 40 around the recess R of the multilayer semiconductor body 20 in detail. As described previously, the insulating part according to an example embodiment includes the protective insulating layer 42, the edge insulating layer 41, and the insulating spacer 44.

A lateral surface of the insulating spacer 44 may have a surface without an angular point from an upper end to a lower end thereof. The insulating spacer 44 may be understood as a result remaining in an internal sidewall of the recess R, by forming a conformal insulating material layer (referring to FIG. 8), and performing anisotropic etching, e.g., dry etching (referring to FIG. 9) until the insulating material layer is removed from a bottom surface of the recess R so that a portion of the first conductivity-type semiconductor layer 22 is removed, e.g., overetching. The resulting insulating spacer 44 may have various structural characteristics different from those of a structure obtained from a process according to the related art, e.g., a photolithographic process.

The insulating spacer 44 employed in an example embodiment may have a continuous surface. The term "continuous surface", used herein, refers to a surface on which a normal inclination is gradually increased (or decreased) or is not changed according to a direction in which a measurement point is changed, when the normal inclination is measured at an arbitrary point on the surface. In contrast, when a normal inclination is first increased and then decreased, or is first decreased and then increased, refers to a discontinuous surface. An inclination may be defined as an angle with a horizontal plane, e.g., the bottom surface of a recess R or the second direction, unless otherwise particularly described.

As illustrated in FIG. 3, normal inclinations α1, α2, and α3 at arbitrary points P1, P2, and P3 located on a lateral surface of the insulating spacer 44, increase (α1<α2<α3) toward a bottom surface of the recess R. The insulating spacer 44 employed in an example embodiment is exemplified in that almost an entirety of a lateral surface has a curved surface, but at least a portion (for example, a lower region) may be formed to be a substantially planar surface (i.e. the normal inclination is not changed substantially in the at least a section). Normal inclinations may not be changed at points on the substantially planar surface. In other words, few variations from normal inclination may be present. When a lateral surface of the insulating spacer 44 is a curved surface, the profile of the lateral surface may be represented by a radius of curvature rather than a normal inclination. For example, a lateral surface of the insulating spacer 44 according to an example embodiment may be represented as being increased in a direction in which a radius of curvature is measured or as not being changed in the direction.

In addition, a width W along the second direction of the insulating spacer 44 at a lower end may be greater than a width thereof at an upper end along the third direction. For example, the width W of the insulating spacer 44 may be increased (for example, ta<tb<tc) or may not be changed toward the bottom surface of the recess R.

The contact area 22C of the first conductivity-type semiconductor layer 22, i.e., a bottom surface of the recess R, may be located at a slightly lower level than a lower surface of the insulating spacer 44. i.e., along the third direction. Here, an insulating material layer may be overetched to be sufficiently removed from the contact area 22C of the first conductivity-type semiconductor layer 22.

Figure 10:
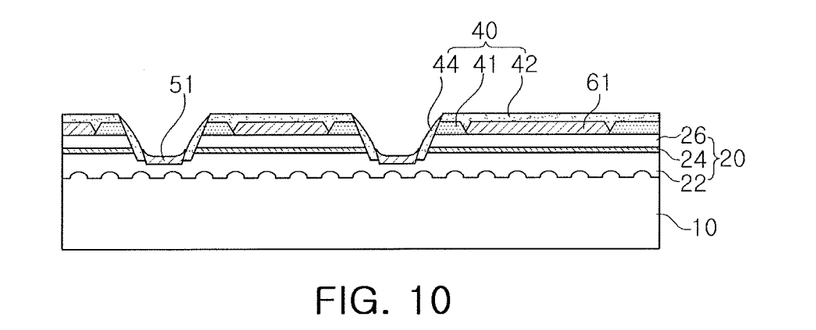
Figure 11:
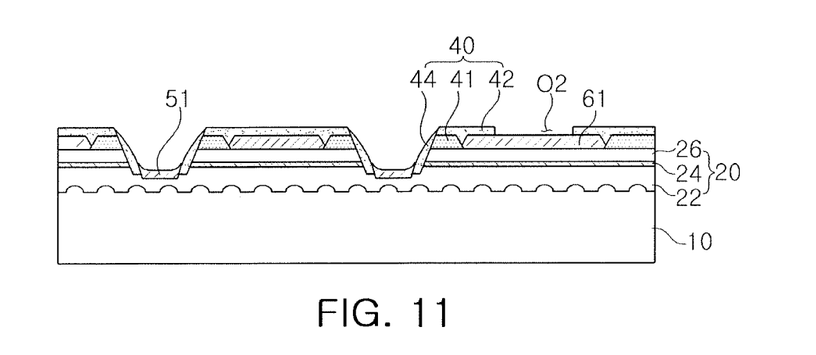

The protective insulating layer 42 may be located on the second contact electrode 61, and may serve to protect the second contact electrode 61 in a spacer formation process (referring to FIGS. 10 and 11). The edge insulating layer 41 may define a region in which the second contact electrode 61 is to be formed. In addition, as the insulating spacer 44 may be thinner in the vicinity of an edge of a mesa structure, the edge insulating layer 41 may serve to allow an edge of a mesa structure MS to be stably insulated without being exposed.

The insulating spacer 44 may not only be located on a lateral surface of the mesa structure MS of the multilayer semiconductor body 20, but may also be located on lateral surfaces of the edge insulating layer 41 and the protective insulating layer 42. For example, the insulating spacer 44, the protective insulating layer 42, and the edge insulating layer 41 may be formed of a silicon oxide film, a silicon nitride film, an insulating polymer, or a combination thereof. In a specific example, the insulating spacer 44 may be formed of the same insulation material as that of the protective insulating layer 42 and the edge insulating layer 41. In the spacer formation process, in order to allow the protective insulating layer 42 to have an etch stop role, the protective insulating layer 42 may include an insulating material having an etch selectivity with respect to the insulating spacer 44. For example, the protective insulating layer 42 may be formed using silicon nitride (SiN) or silicon oxynitride (SiON), and the insulating spacer 44 may be formed using silicon dioxide ($SiO_2$).

FIGS. 4 to 11 are cross sectional views of stages in a method of manufacturing a semiconductor light emitting device according to an example embodiment. The method of manufacturing a semiconductor light emitting device according to an example embodiment will be described as an example of a process of manufacturing the semiconductor light emitting device 100 illustrated in FIG. 2. The same reference numerals used in the previous example embodiment denote the same members, and may be omitted from the following description in order to simplify the description.

Figure 4:
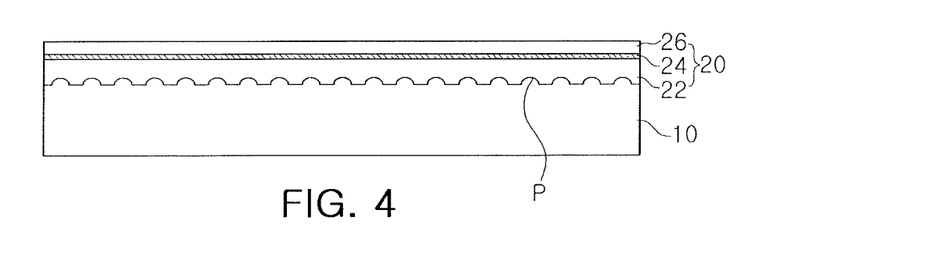
FIGS. 4 to 11 illustrate cross sectional views of stages in a method of manufacturing a semiconductor light emitting device according to an example embodiment.

With reference to FIG. 4, the first conductivity-type semiconductor layer 22, the active layer 24, and the second conductivity-type semiconductor layer 26 are sequentially stacked on the substrate 10 in which a concave and convex pattern P is formed, to form the multilayer semiconductor body 20 for a light emitting structure.

In some example embodiments, the substrate 10 may be formed using sapphire. In this case, the substrate 10 employed in an example embodiment may be prepared using a surface processing technique such as a patterned sapphire substrate (PSS) technique. For example, a method, in which a C (0001) surface of a sapphire substrate is washed and surface-processed, the sapphire substrate is etched using a nickel (Ni) etching mask, and the Ni etching mask is removed, may be used.

The first conductivity-type semiconductor layer 22, the active layer 24, and the second conductivity-type semiconductor layer 26 may be grown using a Metal Organic Chemical Vapor Deposition (MOCVD) process, a Hydride Vapor Phase Epitaxy (HVPE) process, a Molecular Beam Epitaxy (MBE) process, and so forth.

Figure 5:
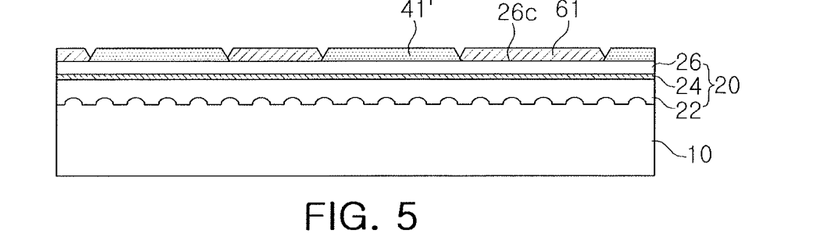

With reference to FIG. 5, a first insulating layer 41' (the edge insulating layer 41 to be formed therefrom) surrounding a region, in which the second contact electrode 61 is to be formed, is formed on an upper surface of the multilayer semiconductor body 20, and the second contact electrode 61 may be deposited on the region.

For example, the first insulating layer 41' may be formed of a silicon oxide film, a silicon nitride film, an insulating polymer, or a combination thereof. In some example embodiments, the first insulating layer 41' may be formed in a plasma enhanced chemical vapor deposition (PECVD) process. For example, the second contact electrode 61 may include a single layer selected from Ag, aluminum (Al), Ni, Cr, palladium (Pd), copper (Cu), platinum (Pt), tin (Sn), tungsten (W), Au, rhodium (Rh), iridium (Ir), ruthenium (Ru), Mg, zinc (Zn), and alloys thereof, or multiple layers formed of a combination thereof. In some example embodiments, the second contact electrode 61 may include a metal layer having ohmic properties and light reflective properties. For example, the second contact electrode 61 may have a Ni/Ag/Pt/titanium (Ti)/Pt stacked structure.

Figure 6:
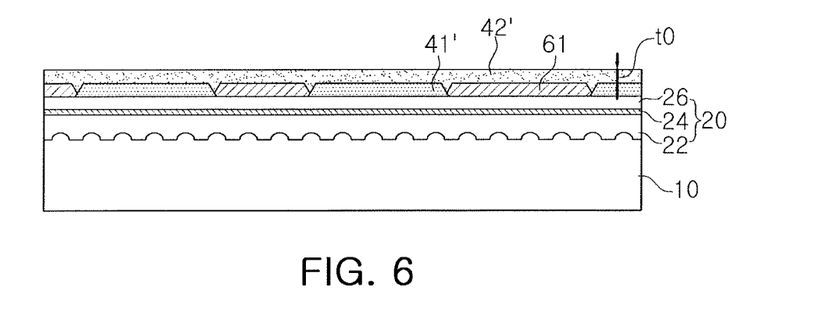

With reference to FIG. 6, a second insulating layer 42' (the protective insulating layer 42 to be formed therefrom) may be formed to cover the second contact electrode 61 on an upper surface of the multilayer semiconductor body 20. For example, the second insulating layer 42' may be formed of a silicon oxide film, a silicon nitride film, an insulating polymer, or a combination thereof. In some example embodiments, the second insulating layer 42' may be formed in a deposition process such as PECVD, sputtering, or the like, in a manner similar to the first insulating layer 41'.

In a subsequent recess formation process (referring to FIG. 9), a certain amount of overetching may be undertaken to completely remove a portion of a third insulating layer 44' located on the contact area 22C. In consideration of a desired residual thickness (t0' in FIG. 9) in addition to overetching conditions, the second insulating layer 42' may be formed to have a proper thickness t0 in FIG. 8.

In addition, the second insulating layer 42' may protect the second contact electrode 61, and may have an etch stop role. In this case, the second insulating layer 42' may include a material having an etch selectivity with respect to an insulating material (44' in FIG. 8) for a spacer.

Figure 7:
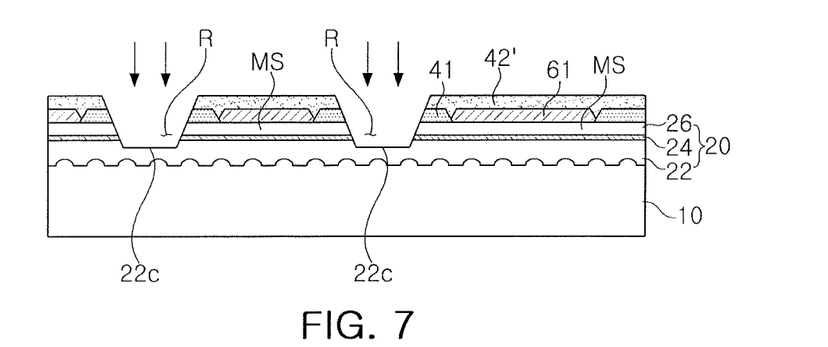

With reference to FIG. 7, the second conductivity-type semiconductor layer 26 and the active layer 24 may be partially removed to expose the contact area 22C of a first conductivity-type semiconductor layer, so as to form the recess R in the multilayer semiconductor body 20.

The contact area 22C of the first conductivity-type semiconductor layer may be exposed to a bottom surface of the recess R. The recess R may have internal sidewalls, and is shown to have a substantially inclined surface, but may have a sidewall substantially perpendicular to an upper surface of the substrate 10 by enhancing anisotropy in an etching process. As an inclination of the internal sidewall is close to perpendicular to an upper surface of the substrate 10, a subsequent spacer formation process may have a beneficial aspect.

In an example embodiment, as a passivation structure with respect to an internal surface of a recess is provided as a spacer structure, a formation area, e.g., along the first and second directions (or a width, e.g., along a second direction), of the recess may be significantly reduced. As an area of a recess allows a removal area of an active layer to be determined, an effective light emitting area of a semiconductor light emitting device according to an example embodiment may be sufficiently secured, which will be described in more detail with respect to FIGS. 12 and 13. In other words, by reducing the area required for the recess, the effective light emitting area may be increased.

A portion of the multilayer semiconductor body 20, not being etched, around the recess R, may be referred to as a mesa structure MS. For example, an internal sidewall of a recess R may be referred to as a lateral surface of a mesa structure MS. In addition, in an example embodiment, the mesa structure MS is exemplified as a single integrated body (referring to FIG. 1). Alternatively, according to a shape and an arrangement of the recess R, the mesa structure MS may be provided as a plurality of mesa structures.

In this process, as illustrated in FIG. 1, in a manner similar to a recess along an edge of the substrate 10, the multilayer semiconductor body 20 may be partially removed from the second conductivity-type semiconductor layer 26. Such a process may be performed with a recess formation process for exposing the contact area 22C. For example, the process may be performed by a reactive ion etching (RIE) process.

Figure 8:
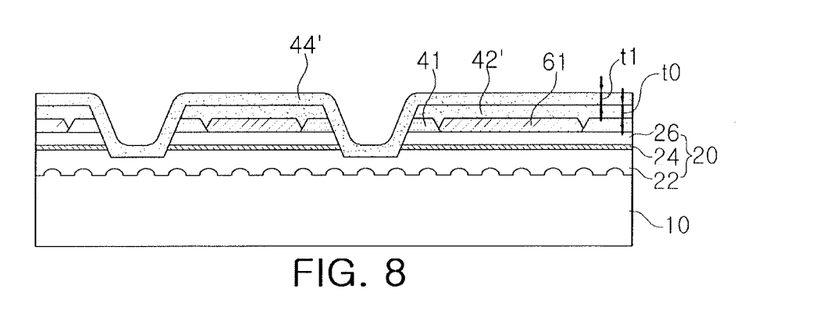

With reference to FIG. 8, a third insulating layer 44' may be formed on the multilayer semiconductor body 20 in which the recess R is formed. The third insulating layer 44' may be conformally formed to have an overall substantially uniform thickness t1. The third insulating layer 44' may be formed to be slightly thinner in an internal sidewall of the recess R depending on a degree of inclination.

As described previously, in order to allow the second insulating layer 42' to serve as an etch stop in a process of etching the third insulating layer 44', the third insulating layer 44' may include a material having a different etch selectivity from that of the second insulating layer 42'. For example, the second insulating layer 42' may be formed of SiN or SiON, and the third insulating layer 44' may be formed of $SiO_2$.

Figure 9:
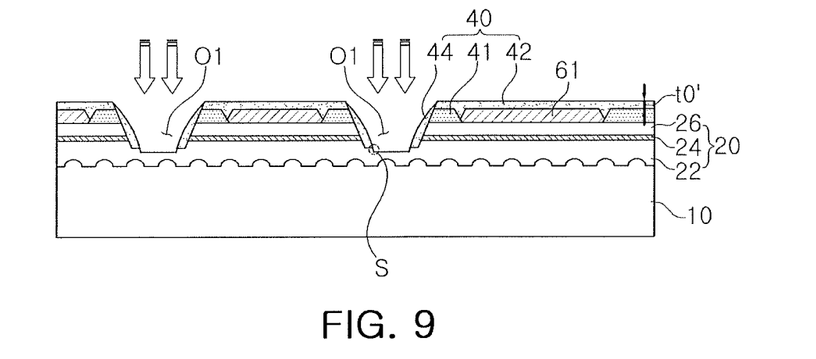

With reference to FIG. 9, anisotropic etching is applied to the third insulating layer 44' to form the insulating spacer 44 on lateral surfaces of the mesa structure MS. Anisotropic etching may be applied until an entirety of a portion of the third insulating layer 44' located on a bottom surface of the recess R is removed. Through the etching process, the contact area 22C of the first conductivity-type semiconductor layer may be exposed on the bottom surface of the recess R. Dry etching such as RIE may be used in the process. Overetching may be applied to sufficiently remove a portion of the third insulating layer 44' from the recess R. Through this process, the first conductivity-type semiconductor layer 22 may have a stepped portion S around a bottom surface of the recess R.

Portions of the third insulating layer 44' located on an upper surface and lateral surfaces of the mesa structure MS may be etched together at a thickness almost the same as a thickness removed from the bottom surface of the recess R. In this etching process, a portion of a third insulating layer 44' on an upper surface of the mesa structure MS is removed. In addition, the second insulating layer 42' is partially removed depending on a degree of progression of overetching resulting in a reduced thickness t0'. In this process, the second insulating layer 42' may protect the second contact electrode 61. When the second insulating layer 42' is formed of a material having an etch selectivity, the second insulating layer may be used as an etch stop layer for protecting the second contact electrode 61 in the etching process.

A portion of the third insulating layer 44' located in an internal sidewall of the recess R remains to form the insulating spacer 44. As described with reference to FIG. 3, a lateral surface of the insulating spacer 44 may have a surface without an angular point from an upper end to a lower end thereof. In other words, a normal inclination at an arbitrary point located on the lateral surface of the insulating spacer 44 may be increased or may not be changed toward the bottom surface of the recess R.

As described above, the first opening O1 exposing the contact area 22C of the first conductivity-type semiconductor layer may be formed through an opening formation process. In the opening formation process, as a mask is not used, an error caused by mask formation is not required to be considered as a margin. Thus, a size of the recess R for securing the same contact area may be significantly decreased as compared to an opening formation process using a mask. As a result, an area of the active layer 24 removed due to recess formation may be reduced, and higher light emitting efficiency may be realized.

With reference to FIG. 10, the first contact electrode 51 may be formed on the contact area 22C exposed to the first opening O1. The first contact electrode 51 may be formed of a single layer selected from Ag, Al, Ni, Cr, Pd, Cu, Pt, Sn, W, Au, Rh, Jr, Ru, Mg, Zn, and alloys thereof, or multiple layers formed of a combination thereof. For example, the first contact electrode 51 may have an Al/Ti/Pt stacked structure.

With reference to FIG. 11, the second opening O2 exposing a portion of a second contact electrode may be formed. A RIE process or a wet etching process using buffered oxide etchant (BOE) may be used. In a subsequent process, the first bonding metal 59 and the second bonding metal 69 are formed to be connected to the first contact electrode 51 and the second contact electrode 61, respectively, so as to complete the semiconductor light emitting device 100 illustrated in FIGS. 1 and 2. For example, the first bonding metal 59 and the second bonding metal 69 may include Au, Sn, or Au/Sn. In some example embodiments, the first bonding metal 59 and the second bonding metal 69 may be formed simultaneously of the same metal. Further, as seen in FIGS. 1 and 2, the spacer SP may be formed therebetween to expose the insulating part 40 between the second opening O2 and the first opening O1 adjacent thereto.

Figure 12:
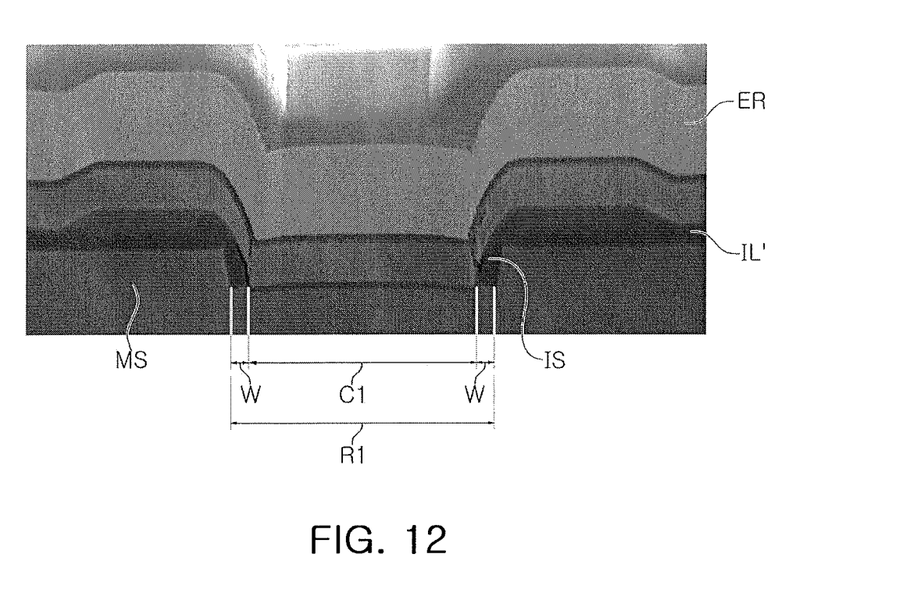
FIGS. 12 and 13 illustrate scanning electron microscope (SEM) images of a cross section of a semiconductor light emitting device according to a first example of an example embodiment and a comparative example.
Figure 13:
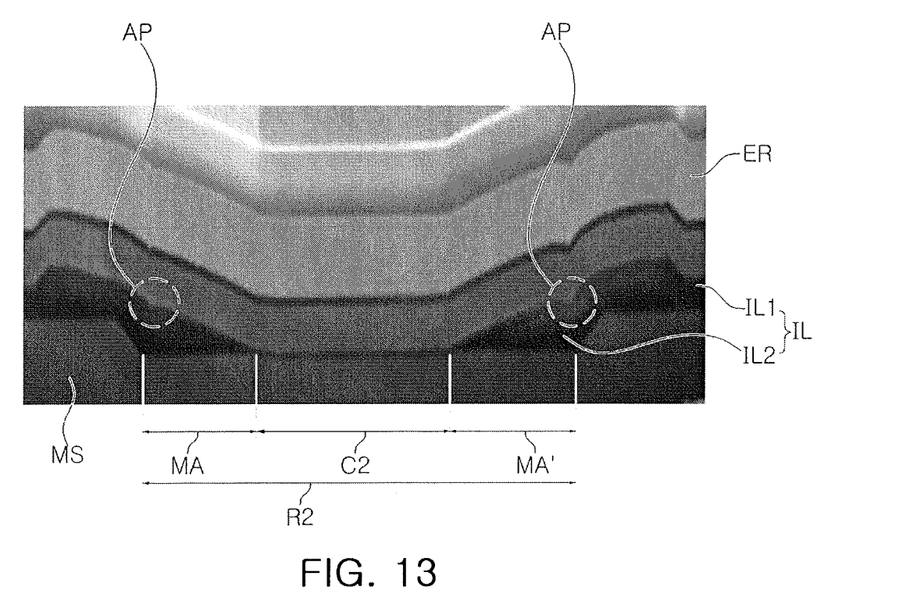

FIGS. 12 and 13 are scanning electron microscope (SEM) images of a cross section of a semiconductor light emitting device according to a first example and a comparative example of an example embodiment.

With reference to FIG. 12, a semiconductor light emitting device (the first example) formed according to an example embodiment may be illustrated. The semiconductor light emitting device according to the first example may include an insulating spacer IS formed according to the previous example embodiment.

As shown in FIG. 12, the insulating spacer IS is disposed on a lateral surface of the mesa structure MS, in other words, on an internal sidewall of a recess, and a protective insulating layer IL' is connected to an insulating spacer and disposed on an upper surface of the mesa structure MS. An electrode ER may be connected to a contact area C1 surrounded by the insulating spacer IS.

With reference to FIG. 13, a semiconductor light emitting device according to the comparative example may allow an opening for a contact area C2 to be formed using a mask process (for example, photolithography) in a manner different from the first example. In detail, an insulating layer IL is formed to cover an internal surface of a recess and an upper surface of a mesa structure, and a mask pattern is formed to selectively remove a portion of the insulating layer located in a bottom surface of a recess. Thus, an opening may be formed for the contact area C2.

As shown in FIG. 13, in consideration of a mask forming process error to form the contact area C2 according to the comparative example, a recess (R2=C2+MA+MA') greater than the contact area C2 desired to have sufficient margins (MA+MA') is required to be formed.

In contrast, in the first example, since an opening may be formed without a mask in a self aligned method, a margin caused by a process error is not required. Thus, in consideration of only a spacer having a thin width, a relatively small recess R1 may be formed. In detail, the contact area C1 according to the first example is slightly greater than the contact area C2 according to the comparative example, but an area of the recess R1 according to the first example is rather significantly smaller than that of the recess area R2 according to the comparative example. For example, in the case of the comparative example, each of both margins may be set to be greater than about 5 µm. In contrast, in the case of the first example, a width W of a lower end of a spacer may be adjusted to be 2 µm or less, and in detail, 1.5 µm or less.

In other words, in accordance with the first example, a surface area along the first and second direction of the contact area C1 may be greater than 50%, e.g., about 80%, of a surface area of the recess R1. Also, a width of the contact area C1 along the second direction may be at least twice and up to about an order of magnitude larger than the width W of the insulating layer IL' on either side of the contact area C1 at the bottom of the recess R1.

When FIG. 12 is compared to FIG. 13, in the case of the insulating layer IL illustrated in FIG. 13, an insulating layer IL2 located in a bottom surface of a recess remains, while only a central portion of the insulating layer is removed. Thus, an angular point AP meeting an insulating layer IL1 located on an upper surface of a mesa structure is present. In contrast, in the case of the insulating spacer IS illustrated in FIG. 12, as described previously, an entirety of a portion of an insulating layer located on a bottom surface of a recess is removed, whereby an angular point may not be present in a spacer only located in an internal sidewall of the recess.

Meanwhile, according to the first example illustrated in FIG. 12, insulating spacers formed on both sides of the opening may be obtained in the same process, thereby being substantially symmetrical to each other, having substantially the same thickness and substantially the same shape. On the other hand, according to the comparative example illustrated in FIG. 13, residual portions of an insulating layer may be asymmetrical, due to one portion MA' being slightly larger than the other portion MA. This asymmetry may be understood as an inevitable result of mask misalignment.

An electrode structure employed in an example embodiment may be variously changed. In an example embodiment, a form, in which the first contact electrode 51 is formed on the first opening O1 and around the first opening with position limitation and a bonding metal is applied thereto, is exemplified. However, the first contact electrode may have a form of an electrode layer to be extended to an upper surface of a mesa structure.

Figure 14:
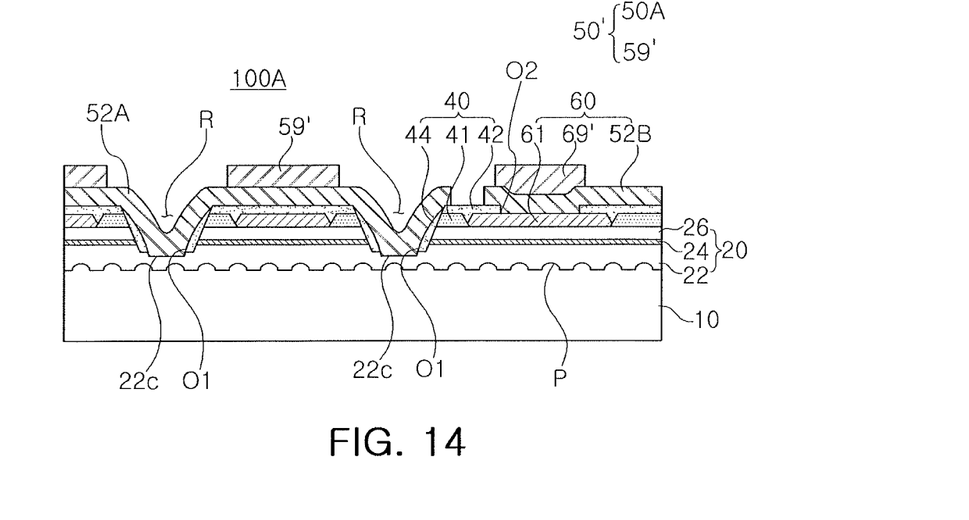
FIG. 14 illustrates a side cross-sectional view of a semiconductor light emitting device according to an example embodiment.

FIG. 14 is a side cross-sectional view illustrating a semiconductor light emitting device according to an example embodiment. The same reference numerals used with reference to FIG. 2 denote the same members, and may be omitted from the following description in order to simplify the description.

With reference to FIG. 14, a first electrode 50' of a semiconductor light emitting device 100A according to an example embodiment may include a first electrode layer 52A connected to a contact area 22C of a first conductivity-type semiconductor layer, and a first bonding metal 59'. The first electrode layer 52A may extend along the third direction to an upper surface of the mesa structure to be disposed on the protective insulating layer 42. The first bonding metal 59' may be disposed on the first electrode layer 52A located on an upper surface of the mesa structure. A second electrode 60' may include the contact electrode 61, a second electrode layer 52B connected to the contact electrode 61 through a second opening O2, and a second bonding metal 69' disposed on the second electrode layer 52B.

After the first opening O1 and the second opening O2 are formed, the second electrode layer 52B may be formed in the same manner as the first electrode layer 52A. For example, the first electrode layer 52A and the second electrode layer 52B may include a single layer selected from Ag, Al, Ni, Cr, Pd, Cu, Pt, Sn, W. Au, Rh, Ir. Ru, Mg, Zn, and alloys thereof, or multiple layers formed of a combination thereof.

In the case of an insulating spacer employed in an example embodiment, a profile of a lateral surface thereof may be variously adjusted using a thickness of a third insulating layer, conditions of an anisotropic etching process, and the like. For example, in an example embodiment illustrated in FIG. 14, a profile of the lateral surface may be smoothly adjusted to prevent disconnection of the first electrode layer 52A on the insulating spacer 44. To this end, the insulating spacer 44 may be provided as two or more insulating spacers, in the same manner as an example embodiment illustrated in FIG. 15.

Figure 15:
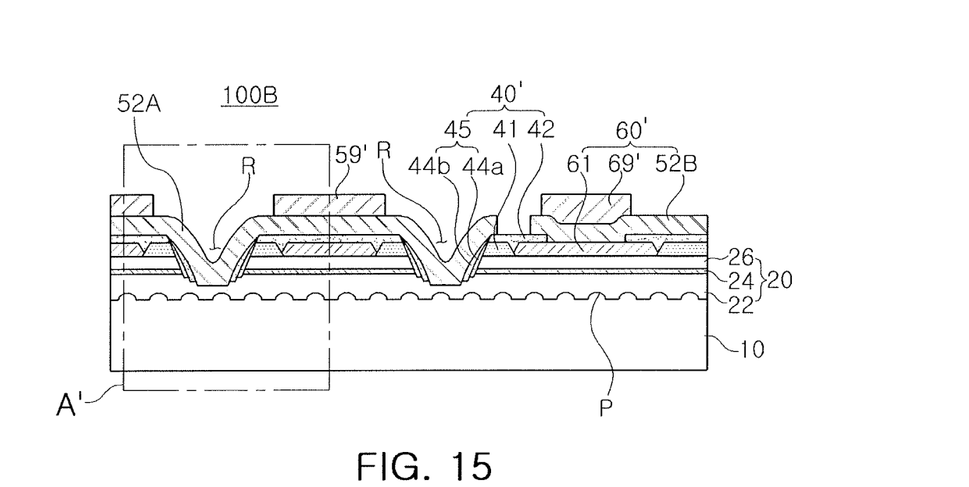
FIG. 15 illustrates a side cross-sectional view of a semiconductor light emitting device according to an example embodiment.

FIG. 15 is a side cross-sectional view illustrating a semiconductor light emitting device 100B according to an example embodiment. With reference to FIG. 15, an insulating part 40' may include an insulating spacer 45, the edge insulating layer 41, and the protective insulating layer 42.

As illustrated in FIG. 15, the first insulating spacer 45 may include a first spacer 44a and a second spacer 44b sequentially disposed on an internal sidewall of the recess R. The first spacer 44a and the second spacer 44b may have a shape in which a width at a lower end is greater than a width at an upper end in a similar manner. A profile of a lateral surface of the second spacer 44b may be more gently sloped, as compared to a profile of a lateral surface of the first spacer 44a.

As a result, the insulating spacer 45 employed in an example embodiment may effectively prevent the first electrode layer 52A formed along a surface of a mesa structure from being disconnected.

Figure 16:
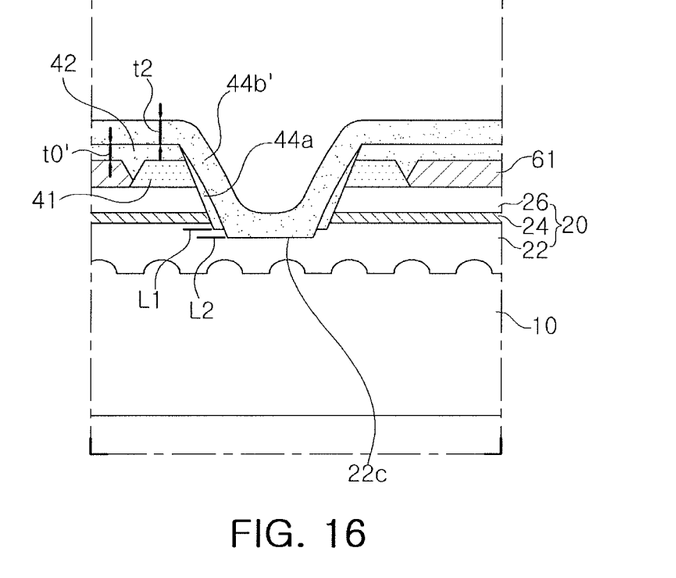
FIGS. 16 to 18 illustrate cross sectional views of stages in a method of manufacturing a semiconductor light emitting device according to an example embodiment.
Figure 17:
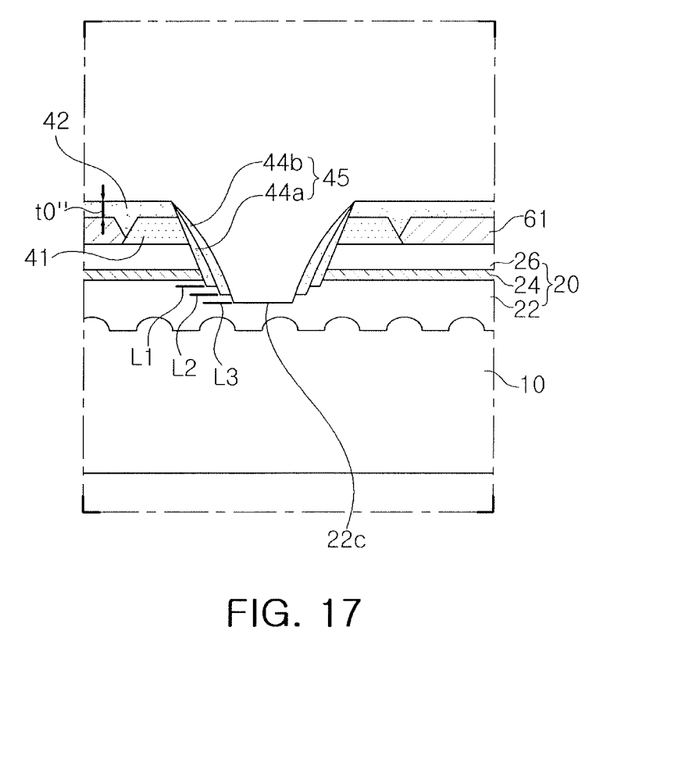
Figure 18:
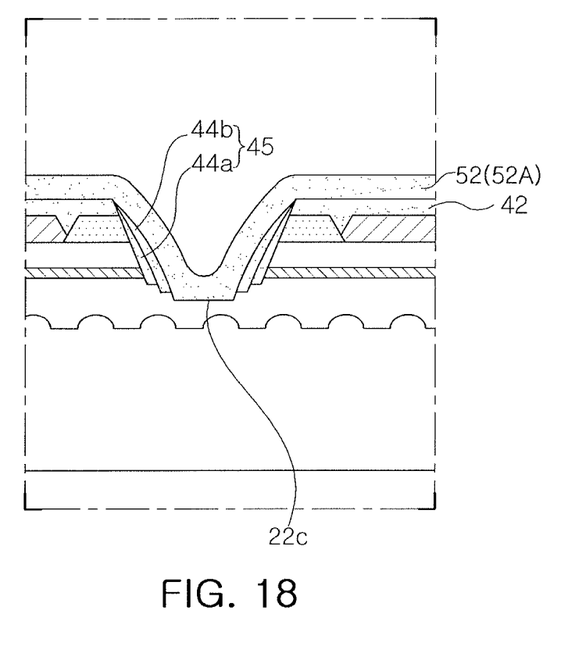

FIGS. 16 to 18 are cross sectional views of stages in a method of manufacturing a semiconductor light emitting device according to an example embodiment. FIGS. 16 to 18 are drawings in which portion A' illustrated in FIG. 15 is enlarged, and a process illustrated in FIG. 16 may be understood as a process following the process illustrated in FIG. 9 of the manufacturing method according to the previous example embodiment. However, the insulating spacer formed in FIG. 16 may be referred to as a first spacer in an example embodiment.

With reference to FIG. 16, an additional insulating layer 44b' may be formed on the multilayer semiconductor body 20 in which the recess R having the insulating layer 44 (now first spacer 44a) is formed. The additional insulating layer 44b' may be conformally formed to have a substantially uniform thickness t2. The additional insulating layer 44b' may be formed of the same material or of a different material as an insulation material for the insulating spacer 44 formed previously.

With reference to FIG. 17, anisotropic etching is applied to the additional insulating layer 44b' to form the second spacer 44b on a lateral surface of the first spacer 44a. In a manner similar to the insulating spacer formation process (referring to FIG. 9) according to the previous example embodiment, anisotropic etching may be applied until an entirety of a portion of the additional insulating layer 44b' located on a bottom surface of the recess R is removed. Through the etching process, the contact area 22C of the first conductivity-type semiconductor layer may be exposed on the bottom surface of the recess R. In the process, a thickness of the protective insulating layer 42, protecting the second contact electrode 61 and used as an etch stop layer, may be additionally reduced to a thickness t0" from that of t0' in FIGS. 9 and 16.

Even when the first spacer 44a and the second spacer 44b are formed of substantially the same material, they may be distinguished from each other due to levels of lower surfaces thereof. As illustrated in FIG. 17, a level L2 of a lower surface of the second spacer 44b may be lower than a level L1 of a lower surface of the first spacer 44a, and a level L3 of the contact area 22C of the first conductivity-type semiconductor layer 22 may be lower than the level L2 of the lower surface of the second spacer 44b.

With reference to FIG. 18, an electrode layer 52 may be formed to be connected to a contact area 22C of a first conductivity-type semiconductor layer. The electrode layer 52 may be extended on an upper surface of the mesa structure along a lateral surface of an insulating spacer 45 to be disposed on the protective insulating layer 42. The insulating spacer 44 employed in an example embodiment may have a degree of shallow inclination due to the second spacer 44b, and may prevent an electrode layer from being disconnected. The first spacer 44a and the second spacer 44b may be implemented to have a very low thickness (1 μm or less). Thus, even when the first spacer and the second spacer are provided as a plurality of spacers, a sufficient contact area may be secured without an increase in a recess.

Figure 19:
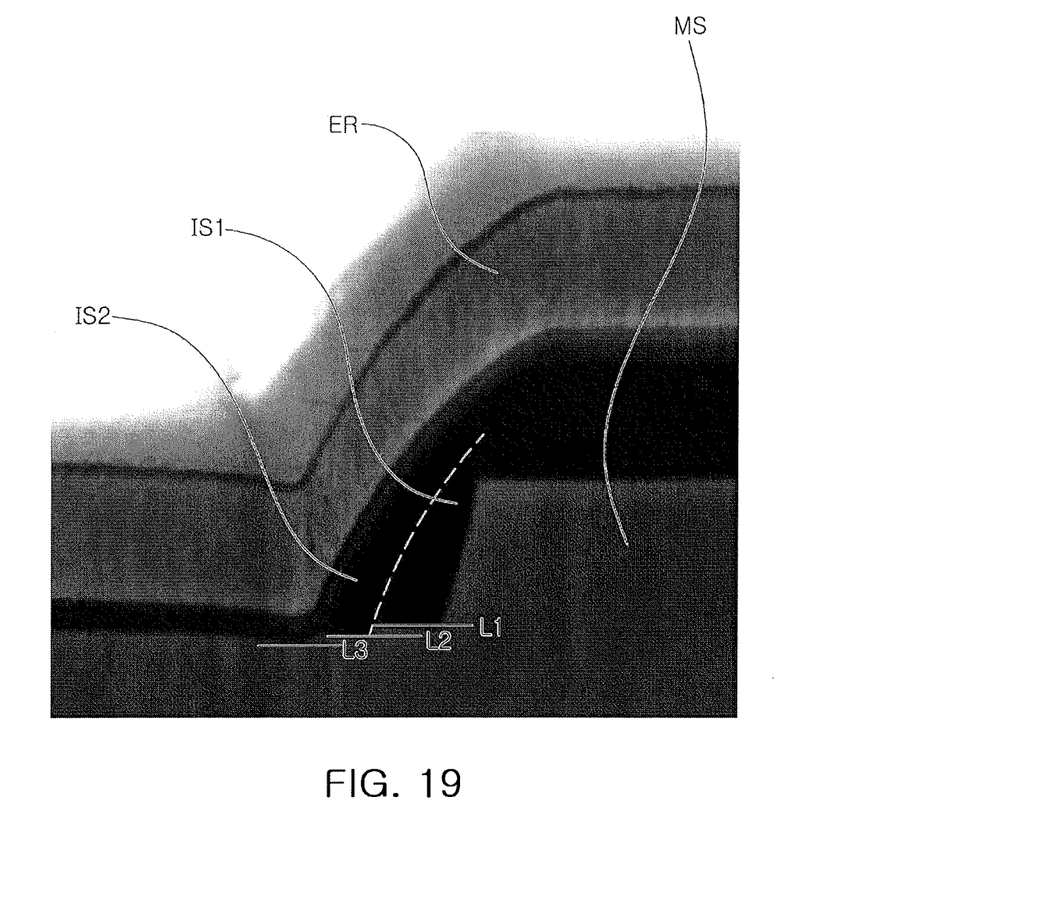
FIG. 19 illustrates an SEM image of a cross section of a semiconductor light emitting device according to a second example of an example embodiment.

FIG. 19 is an SEM image of a cross section of a semiconductor light emitting device according to a second example of an example embodiment. Here, the semiconductor light emitting device may have a double spacer structure in a manner similar to the example embodiment illustrated in FIG. 15.

With reference to FIG. 19, a second spacer IL2 may be formed on a first spacer IL1 disposed on a lateral surface of a mesa structure MS, under substantially the same conditions as the first spacer IL1. As a result, a lateral surface of the second spacer IL2 is confirmed to have an overall shallow inclined surface as compared to a lateral surface of the first spacer IL1. In addition, overetching is applied for each etching process for formation of the first spacer IL1 and the second spacer IL2. Thus, as illustrated in FIG. 19, a lower surface of the second spacer IL2 may be confirmed to be located at a lower level (L2<L1) than a lower surface of the first spacer ILL and a contact area of the first conductivity-type semiconductor layer may be confirmed to be located at a lower level (L3<L2) than a lower surface of the second spacer IL2.

Figure 20:
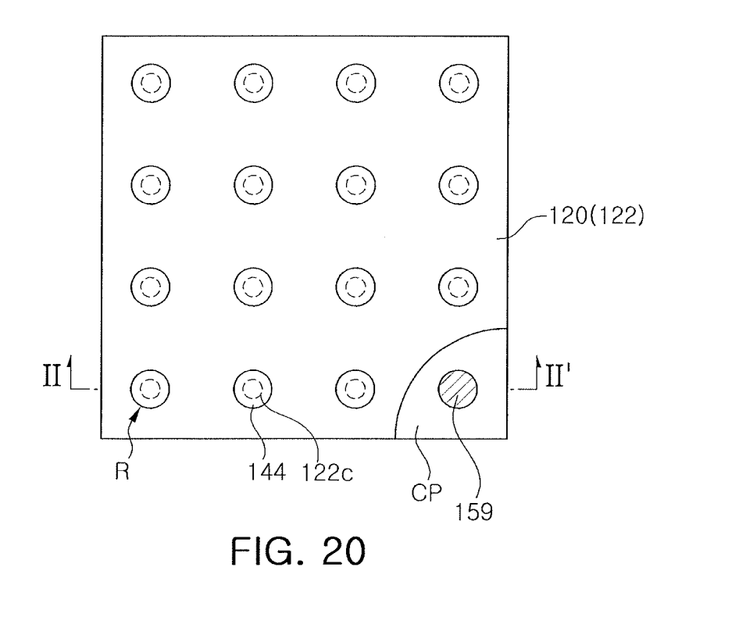
FIGS. 20 and 21 illustrate a plan view and a side cross-sectional view illustrating a semiconductor light emitting device according to an example embodiment.
Figure 21:
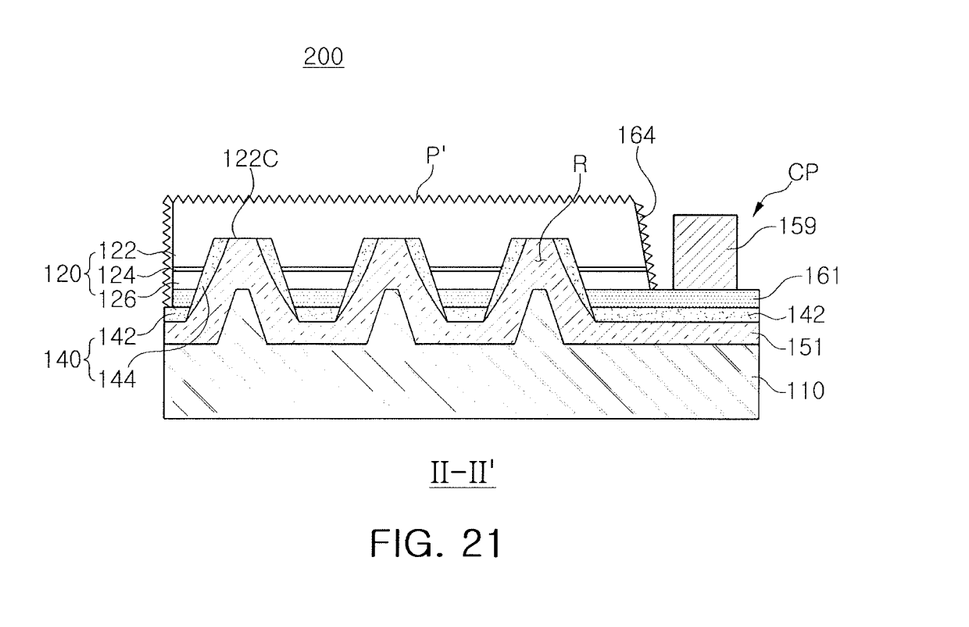

FIGS. 20 and 21 are a plan view and a side cross-sectional view illustrating a semiconductor light emitting device according to an example embodiment. FIG. 21 may be understood as a side cross-sectional view in which a semiconductor light emitting device 200 illustrated in FIG. 20 is taken along line II-II'.

With reference to FIGS. 20 and 21, the semiconductor light emitting device 200 may include a conductive substrate 110, and a multilayer semiconductor body 120 disposed on the conductive substrate 110.

The conductive substrate 110 may be provided as a metallic substrate or a semiconductor substrate. In some example embodiments, the conductive substrate 110 may include at least one of Au, Ni, Al, Cu, W, Si, selenium (Se), and gallium arsenide (GaAs). For example, the conductive substrate 110 may include a Si substrate doped with Al.

A main portion of an upper surface of the conductive substrate 110 may be covered with the multilayer semiconductor body 120. Another portion of the upper surface of the conductive substrate 110, i.e., a region not covered with the multilayer semiconductor body 120 may be provided as a bonding area CP in which a bonding pad 159 is to be formed.

The bonding area CP, as illustrated in FIG. 20, may be provided to be adjacent to one corner portion of the conductive substrate 110, but is not limited thereto. For example, the bonding area CP may be located on a central portion of the conductive substrate 110 or an arbitrary region between another corner portion and a central portion of the conductive substrate 110, and may be provided as a plurality of bonding areas.

The multilayer semiconductor body 120 may include the first conductivity-type semiconductor layer 122, the active layer 124, and the second conductivity-type semiconductor layer 126. A first electrode layer 151 may be connected to a contact area 122C of the first conductivity-type semiconductor layer 122 through a recess R in the form of a hole that extends along the third direction through the second conductivity-type semiconductor layer 126, the active layer 124, and a portion of the first conductivity-type semiconductor layer 122.

A second electrode layer 161 may be disposed on an upper surface, i.e., a surface furthest from the first conductivity-type semiconductor layer, of the second conductivity-type semiconductor layer 126 to be connected to the second conductivity-type semiconductor layer 126. The second electrode layer 161 may be extended along the second direction to the bonding area CP to be connected to the bonding pad 159.

An insulating part 140 may be provided to allow a portion of the multilayer semiconductor body 120, except for the contact area 122C of the first conductivity-type semiconductor layer, to be electrically insulated from the first electrode layer 151. The insulating part 140 may include a protective insulating layer 142 disposed on the second conductivity-type semiconductor layer 126 to cover the second electrode layer 161, i.e., between the second electrode layer 161 and the second conductivity-type semiconductor layer 126, and an insulating spacer 144 connected to the protective insulating layer 142 to be disposed on an internal sidewall of the recess R. As described previously, a normal inclination at an arbitrary point located on a lateral surface of the insulating spacer 144 may be increased toward a bottom surface of the recess R or may not be changed. In other words, a lateral surface of the insulating spacer 144 may have a surface without an angular point from an upper end to a lower end thereof.

In the first conductivity-type semiconductor layer 122, a concave and convex pattern P' may be formed in a surface opposite to a surface facing the active layer 124. The concave and convex pattern P' may serve to suppress internal optical loss, as light generated from the active layer 124 is smoothly emitted externally. A passivation layer 164 may be formed on a lateral surface of the multilayer semiconductor body 120. The passivation layer 164 may include an oxide, a nitride, an insulating polymer, or a combination thereof. A concave and convex pattern may additionally be formed on a surface of the passivation layer 164 to enhance light extraction efficiency.

As set forth above, a spacer formed by self-aligning around a contact region of a recess is employed as a passivation to reduce a removed area of an active layer caused by recess formation. Embodiments may provide a semiconductor light emitting device for reducing an area in which an active layer is removed while a contact area is provided, and a method of manufacturing the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor light emitting device, comprising:
   a multilayer semiconductor body including
      a first conductivity-type semiconductor layer,
      a second conductivity-type semiconductor layer,
      an active layer between the first conductivity-type semiconductor layer and the second conductivity-type semiconductor layer, and
      at least one recess passing through the second conductivity-type semiconductor layer and the active layer to expose the first conductivity-type semiconductor layer;
   an insulating part on an internal sidewall of the at least one recess and on an upper surface of the second conductivity-type semiconductor layer, the insulating part having at least one first opening that exposes the first conductivity-type semiconductor layer and at least one second opening that exposes the second conductivity-type semiconductor layer;
   a first electrode connected to a portion of the first conductivity-type semiconductor layer through the at least one first opening; and
   a second electrode connected to a portion of the second conductivity-type semiconductor layer through the at least one second opening, wherein
   the insulating part has an insulating spacer on the internal sidewall of the recess, a lateral surface of the insulating spacer having a surface without an angular point from an upper end adjacent an upper surface of the second conductivity-type semiconductor layer to a lower end thereof below an upper surface of the first electrode,
   the insulating spacer includes a first spacer and a second spacer sequentially disposed on the internal sidewall of the recess,
   a lower end of the second spacer is lower than a lower end of the first spacer, and
   a bottom of the first conductivity-type semiconductor layer is lower than the lower end of the second spacer.

2. The semiconductor light emitting device as claimed in claim 1, wherein a normal inclination at an arbitrary point located on the lateral surface of the insulating spacer is increased or is not changed toward a bottom surface of the recess.

3. The semiconductor light emitting device as claimed in claim 1, wherein both cross sections of the insulating spacer have shapes symmetrical to each other in a cross section passing through the at least one first opening.

4. The semiconductor light emitting device as claimed in claim 1, wherein a width of the lower end of the insulating spacer is greater than a width of the upper end of the insulating spacer.

5. The semiconductor light emitting device as claimed in claim 1, wherein a width of the lower end of the insulating spacer is 2 μm or less.

6. The semiconductor light emitting device as claimed in claim 1, wherein the insulating part further includes a protective insulating layer on an upper surface of the second conductivity-type semiconductor layer and having the at least one second opening.

7. The semiconductor light emitting device as claimed in claim 6, wherein the protective insulating layer is formed of a material having an etch selectivity with respect to the insulating spacer.

8. The semiconductor light emitting device as claimed in claim 6, wherein the second electrode includes a contact electrode on the second conductivity-type semiconductor layer, and an electrode layer on the protective insulating layer and connected to the contact electrode through the at least one second opening.

9. The semiconductor light emitting device as claimed in claim 8, wherein the insulating part further includes an edge insulating layer around the contact electrode along an edge of the upper surface of the second conductivity-type semiconductor layer.

10. The semiconductor light emitting device as claimed in claim 1, wherein the first electrode extends to a portion of the insulating part located on the second conductivity-type semiconductor layer along the insulating spacer.

11. The semiconductor light emitting device as claimed in claim 1, wherein a planar shape of the recess is a linear shape, a circular shape, or a combination thereof.

12. The semiconductor light emitting device as claimed in claim 1, wherein an entirety of the lateral surface of the insulating spacer is without an angular point.

* * * * *